(12) United States Patent
Idehara

(10) Patent No.: US 6,859,389 B2
(45) Date of Patent: Feb. 22, 2005

(54) PHASE CHANGE-TYPE MEMORY ELEMENT AND PROCESS FOR PRODUCING THE SAME

(75) Inventor: Tomoyuki Idehara, Shinjuku-ku (JP)

(73) Assignee: Dai Nippon Printing Co., Ltd. (JP)

(*) Notice: Subject to any disclaimer, the term of this patent is extended or adjusted under 35 U.S.C. 154(b) by 0 days.

(21) Appl. No.: 10/694,401

(22) Filed: Oct. 28, 2003

(65) Prior Publication Data
US 2004/0208038 A1 Oct. 21, 2004

(30) Foreign Application Priority Data
Oct. 31, 2002 (JP) ........................................ 2002-317184

(51) Int. Cl.[7] ............................................... G11C 11/00
(52) U.S. Cl. .................................... 365/163; 257/296
(58) Field of Search .......................... 365/163; 257/296, 257/2

(56) References Cited

U.S. PATENT DOCUMENTS 6,150,253 A * 11/2000 Doan et al. ................. 438/597
6,555,860 B2 * 4/2003 Lowrey et al. ............. 257/296
6,693,044 B1 * 2/2004 Yamazaki et al. .......... 438/745

* cited by examiner

Primary Examiner—Son T. Dinh
(74) Attorney, Agent, or Firm—Parkhurst & Wendel, L.L.P.

(57) ABSTRACT

There are provided a phase change-type memory element, which can reduce a reset pulse current value necessary for returning the phase state from an ON state to an OFF state, can improve integration density, is not restricted by the process temperature at the time of the production thereof, and can be simply produced, and a process for producing the same. The phase change-type memory element comprises: two or more electrodes provided opposite to each other through an insulating layer; an exposed surface on which at least a part of the insulating layer and at least a part of each of the electrodes are exposed; and a phase change recording material layer provided, on the exposed surface, in contact with the at least two electrodes. The production process of the phase change-type memory element comprises the steps of: providing two or more electrodes opposite to each other through an insulating material; forming an exposed surface on which at least a part of the insulating material and at least a part of each of the electrodes are exposed; and forming a phase change recording material layer on the exposed surface so as to be in contact with at least two of the electrodes.

8 Claims, 10 Drawing Sheets

PHASE CHANGE-TYPE MEMORY ELEMENT AND PROCESS FOR PRODUCING THE SAME

TECHNICAL FIELD

The present invention relates to an erasable nonvolatile memory element/device, particularly a phase change-type memory element, and a process for producing the same.

BACKGROUND OF THE INVENTION

A phase change-type memory element is disclosed in Japanese Patent Laid-Open No. 21740/1993. This phase change-type memory element utilizes, as a recording material, an electrically rewritable and erasable phase-change material, for example, a material which enables electrical switching between a substantially amorphous state and a substantially crystalline state or between different resistance states while maintaining the crystalline state.

The structure of the phase change-type memory element disclosed in Japanese Patent Laid-Open No. 21740/1993 is such that a recording material (a phase change material) is provided between electrodes, and an insulating layer with an opening having a predetermined size is interposed between the electrodes and the recording material. Upon the application of a set pulse across the electrodes, the phase state is brought to an ON state, and upon the application of a reset pulse, the phase state is returned to an OFF state. Since, however, the diameter of a current path formed in the recording material upon the application of voltage is as large as 2 to 3 $\mu$m, the volume of the phase change area is large. This poses a problem that a large current pulse is necessary as a reset pulse for returning the phase state from the ON state to the OFF state. Further, the recording material except for the phase change area should be in an amorphous state. This necessitates the production of the phase change-type memory element at a temperature at or below the crystallization temperature of the recording material. Therefore, for example, the temperature in the production of transistors or diodes constituting a drive circuit is disadvantageously restricted.

On the other hand, Japanese Patent Laid-Open No. 45583/1992 discloses a phase change-type memory element having a structure including an insulating layer having a contact hole having an inner diameter of 0.1 to 1.5 $\mu$m. A recording material layer is provided on one side of the insulating layer so as to fill the inside of the contact hole, and the recording material layer and the insulating layer are sandwiched between lower and upper electrodes. Further, Japanese Patent Laid-Open No. 45585/1992 discloses a phase change-type memory element including a recording material in a columnar form having a diameter of 0.1 to 1.5 $\mu$m provided between upper and lower electrodes. An insulating layer is provided on the periphery of the recording material.

In the phase change-type memory elements disclosed in Japanese Patent Laid-Open Nos. 45583/1992 and 45585/1992, the reset pulse current necessary for returning the phase state from an ON state to an OFF state is relatively small and there is no restriction on the process temperature. However, the formation of the contact hole having an inner diameter of 0.1 to 1.5 $\mu$m and the formation of a columnar recording material having a diameter of 0.1 to 1.5 $\mu$m requires advanced techniques, disadvantageously resulting in lowered yields. Further, there is a limit to the production technology for a reduction in inner diameter of the contact hole to be filled with the recording material or a reduction in diameter of the recording material. In the phase change-type memory elements having structures as disclosed in Japanese Patent Laid-Open Nos. 45583/1992 and 45585/1992, there is a limit to an improvement in integration density.

DISCLOSURE OF THE INVENTION

The present invention has been made under these circumstances, and an object of the present invention is to provide a phase change-type memory element, which can reduce a necessary reset pulse current value for returning the phase state from an ON state to an OFF state, can improve integration density, is not restricted by the process temperature at the time of the production thereof, and can be simply produced, and to provide a process for producing the same.

The above object of the present invention can be attained by a phase change-type memory element comprising: two or more electrodes provided opposite to each other through an insulating layer; an exposed surface on which at least a part of the insulating layer and at least a part of each of the electrodes are exposed; and a phase change recording material layer provided, on the exposed surface, in contact with said at least two electrodes.

In another embodiment of the present invention, the exposed surface is constituted by at least one of a plane surface, a multiplane surface, and a curved surface.

In still another embodiment of the present invention, the phase change recording material layer has a thickness in the range of 1 to 1,000 nm.

In a further embodiment of the present invention, the insulating layer interposed between a pair of the electrodes constituting one memory area has a thickness in the range of 10 to 1,000 nm.

In a still further embodiment of the present invention, the phase change recording material layer contains at least one chalcogenide, or alternatively the phase change recording material layer is formed of an organic material.

In another embodiment of the present invention, a barrier layer and/or a heat control layer are provided between the exposed surface and the phase change recording material layer.

According to the present invention, there is provided a process for producing a phase change-type memory element, comprising the steps of: providing two or more electrodes opposite to each other through an insulating material; forming an exposed surface on which at least a part of the insulating material and at least a part of each of the electrodes are exposed; and forming a phase change recording material layer on the exposed surface so as to be in contact with at least two of the electrodes.

BEST MODE FOR CARRYING OUT THE INVENTION

The present invention will be described with reference to the accompanying drawings.

Phase Change-Type Memory Element

Figure 1:
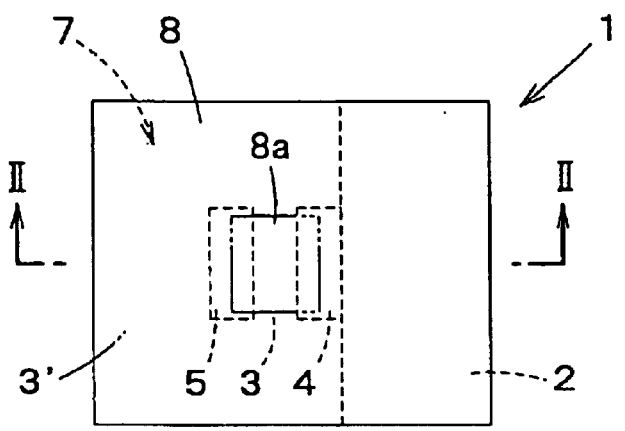
FIG. 1 is a plan view showing the basic construction of an embodiment of the phase change-type memory element according to the present invention.
Figure 2:
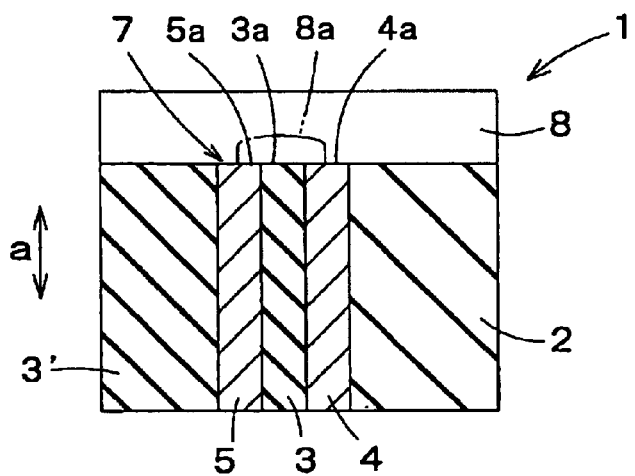
FIG. 2 is a longitudinal sectional view taken on line II—II of FIG. 1 showing a phase change-type memory element.

FIG. 1 is a plan view showing the basic construction of an embodiment of the phase change-type memory element according to the present invention, and FIG. 2 a longitudinal sectional view taken on line II—II of FIG. 1 showing a phase change-type memory element. In FIGS. 1 and 2, a phase change-type memory element 1 includes a substrate 2, an electrode 4 provided on one side of the substrate 2, an electrode 5 provided through an insulating layer 3 on the electrode 4, and an insulating layer 3' provided so as to cover a laminate of the electrode 4, the insulating layer 3, and the electrode 5. A phase change recording material layer 8 is provided on a planar exposed surface 7 constituted by an exposed end face 4a of the electrode 4, an exposed end face 3a of the insulating layer 3, and an exposed end face 5a of the electrode 5. The phase change recording material layer 8 provided on the exposed surface 7 is in contact with the end face 4a of the electrode 4 and the end face 5a of the electrode 5 which are separated from each other by the end face 3a of the insulating layer 3.

In this phase change-type memory element 1, a pair of the electrodes 4, 5 and the phase change recording material layer 8 constitute a memory area. Upon the application of a set pulse across the pair of the electrode 4 and the electrode 5, a current path along the exposed surface 7 is formed in the phase change recording material layer 8 to constitute a phase change area 8a. In the phase change area 8a, Joule heat is generated to cause a phase change from an amorphous state to a crystalline state. This phase change in turn lowers the electric resistance value to bring the phase change-type memory element 1 to an ON state. Upon the application of a reset pulse across the electrode 4 and the electrode 5, Joule heat is generated in the phase change area 8a. This heat is absorbed in the phase change recording material layer 8 surrounding the phase change area 8a, resulting in rapid cooling of the phase change area 8a. As a result, the phase change area 8a undergoes a phase change, and the phase state is returned from the crystalline state to the amorphous state. This causes the electrical resistance value to be increased to bring the phase change-type memory element 1 to an OFF state. In this phase change-type memory element 1, reading can be carried out, for example, by applying a read pulse to the electrode 4 and reading the output of the electrode 5 which undergoes a change according to the ON state and OFF state of the phase change area 8a.

Thus, in the phase change-type memory element 1 according to the present invention, the current path is formed along the exposed surface 7 in the phase change recording material layer 8, and the volume of the phase change area 8a of which the state is reversibly changed between the ON state and the OFF state is small. Therefore, the current value of the reset pulse for returning the ON state to the OFF state is small. Further, since the formation of the phase change recording material layer 8 is the final step in the production of the phase change-type memory element 1, the formation of the phase change recording material layer 8 is not restricted by the process temperature in the previous steps.

The substrate 2 constituting the phase change-type memory element 1 according to the present invention may be, for example, a single-crystal semiconductor substrate, a glass substrate, a silicon wafer, a polycarbonate substrate, an acrylic substrate, a polyethylene terephthalate substrate, a polypropylene substrate, or a film. The insulating layers 3,3' may be formed of a conventional insulating material such as silicon oxide (SiOx), alumina, steatite, polyimide, polyethylene, polypropylene, ethylene tetrafluoride, polyvinyl chloride, or glass. The thickness T1 of the insulating layer 3 for separating the electrode 4 from the electrode 5 may be in the range of 10 to 1,000 nm, preferably in the range of 10 to 300 nm. When the thickness of the insulating layer 3 is less than 10 nm, the insulation between the electrodes is unsatisfactory. Further, in this case, the yield in the formation of the insulating layer 3 is lowered. On the other hand, a thickness of the insulating layer 3 exceeding 1,000 nm is disadvantageously an obstacle to an improvement in the integration density.

The electrodes 4, 5 constituting the phase change-type memory element 1 may be formed of a conventional electrically conductive material, for example, a transparent electrically conductive material such as nickel (Ni), aluminum (Al), gold (Au), copper (Cu), silver (Ag), molybdenum (Mo), titanium (Ti), tungsten (W), tantalum (Ta), chromium (Cr), or an alloy thereof, or indium tin oxide (ITO), indium titanium (IT), or zinc oxide (ZnO). The thickness T2 of the electrodes 4, 5 may be in the range of 10 to 1,000 nm, preferably in the range of 10 to 300 nm. The width W of the electrodes 4, 5 may be in the range of 0.05 to 15 μm, preferably 0.05 to 1.0 μm.

The phase change recording material layer 8 constituting the phase change-type memory element 1 may be formed of an inorganic material, for example, a chalcogenide or an alloy or mixture of elements selected from tellurium (Te), sulfur (S), selenium (Se), germanium (Ge), antimony (Sb), indium (In), gallium (Ga), bismuth (Bi), silver (Ag), lead (Pb), tin (Sn), arsenic (As), silicon (Si), phosphorus (P), and oxygen (O), or an organic material such as 2-amino-4,5-imidazoledicarbonitrile (AIDCN) or N-(3-nitrobenzylidene)-p-phenylenediamine (NBPDA). In the embodiment shown in the drawing, the phase change recording material layer 8 is provided on the whole area of the exposed surface 7. The present invention, however, is not limited to this embodiment only, and the phase change recording material layer 8 may be provided in any form so far as the phase change recording material layer 8 is in contact with the end face 4a of the electrode 4 and the end face 5a of the electrode 5. The thickness of the phase change recording material layer 8 may be in the range of 1 to 1,000 nm, preferably in the range of 1 to 500 nm.

In the above embodiment, the exposed end face 4a of the electrode 4, the exposed end face 3a of the insulating layer 3, and the end face 5a of the electrode 5 constitute the planar exposed face 7. The present invention, however, is not limited to this only. For example, the end face 4a, the end face 3a, and the end face 5a are each plane and are disposed so as to be continued at a predetermined angle to constitute a multiplane shape. Alternatively, the exposed surface 7 may be a curved surface.

Figure 3:
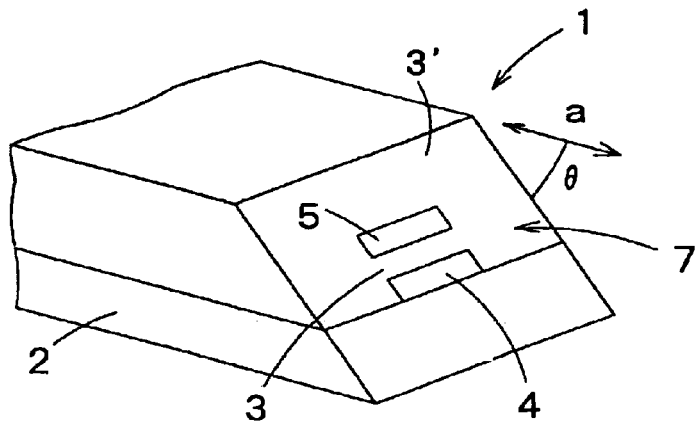
FIG. 3 is a perspective view showing another embodiment of the phase change-type memory element according to the present invention.

In the embodiment shown in the drawing, the angle of the direction, in which the electrodes 4, 5 are elongated (a direction indicated by an arrow a in FIG. 2), to the exposed surface 7 is 90 degrees. The present invention, however, is not limited to this only. For example, as shown in FIG. 3, the angle θ of the direction, in which the electrodes 4, 5 are elongated (a direction indicated by an arrow a in FIG. 3), to the exposed surface 7 may be less than 90 degrees.

Further, in the present invention, in the phase change-type memory element 1, the phase change recording material layer 8 may be provided on the exposed surface 7 through at least one of a barrier layer and a heat control layer. When both the barrier layer and the heat control layer are formed, preferably, they are stacked so that the heat control layer is located on the exposed surface 7 side. The barrier layer functions to maintain continuity between the phase change recording material layer 8 and the electrodes 4, 5 and, at the same time, to prevent the diffusion of foreign matter into the phase change recording material layer 8 or the diffusion of the phase change recording material into other layer(s). The barrier layer may be formed of, for example, a material selected from titanium (Ti), vanadium (V), chromium (Cr), zirconium (Zr), niobium (Nb), molybdenum (Mo), hafnium (Hf), tantalum (Ta), tungsten (W), boron (B), carbon (C), nitrogen (N), oxygen (O), aluminum (Al), silicon (Si), phosphorus (P), sulfur (S), and nickel (Ni) and alloys or combinations of these elements. The heat control layer functions to control the release of the generated heat and may be formed of a material selected from carbon, fluorine (F), oxygen, nitrogen, silicon, hafnium, and $Al_2O_3$ and alloys or combinations of these elements.

Figure 4:
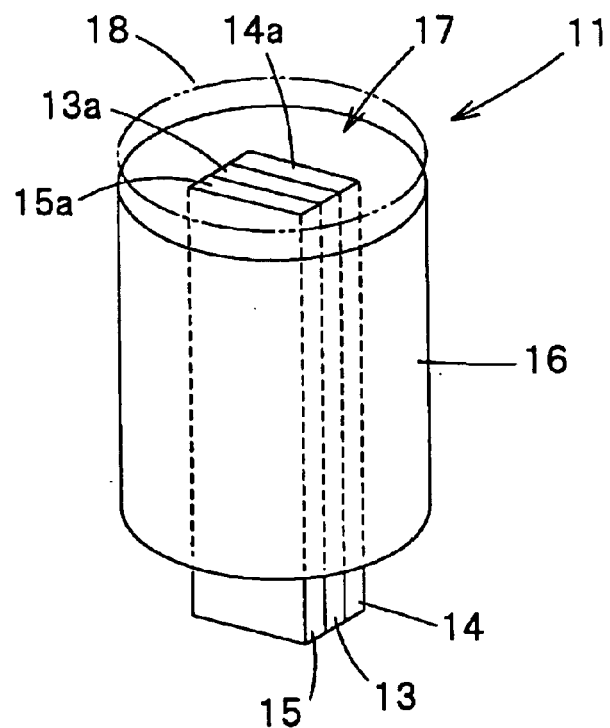
FIG. 4 is a perspective view showing still another embodiment of the phase change-type memory element according to the present invention.

The phase change-type memory element according to the present invention may not be provided with any substrate. FIG. 4 is a perspective view showing an embodiment of this type of a phase change-type memory element. In FIG. 4, a phase change-type memory element 11 includes a pair of electrodes 14, 15, which are provided opposite to each other through an insulating layer 13, and an insulator 16 provided to seal a laminate of the insulating layer 13 and the electrodes 14, 15. Further, a phase change recording material layer 18 is provided on a planar exposed surface 17 constituted by an exposed end face 13a of the insulating layer 13, an exposed end face 14a of the electrode 14, and an exposed end face 15a of the electrode 15. In the embodiment shown in the drawing, the phase change recording material layer 18, indicated by an imaginary line (a chain double-dashed line), is provided on the whole area of the exposed surface 17. For the phase change recording material layer 18, however, the position, size and the like are not particularly limited so far as the phase change recording material layer 18 is in contact with the end face 14a of the electrode 14 and the end face 15a of the electrode 15 which are separated from each other by the end face 13a of the insulating layer 13.

Figure 5:
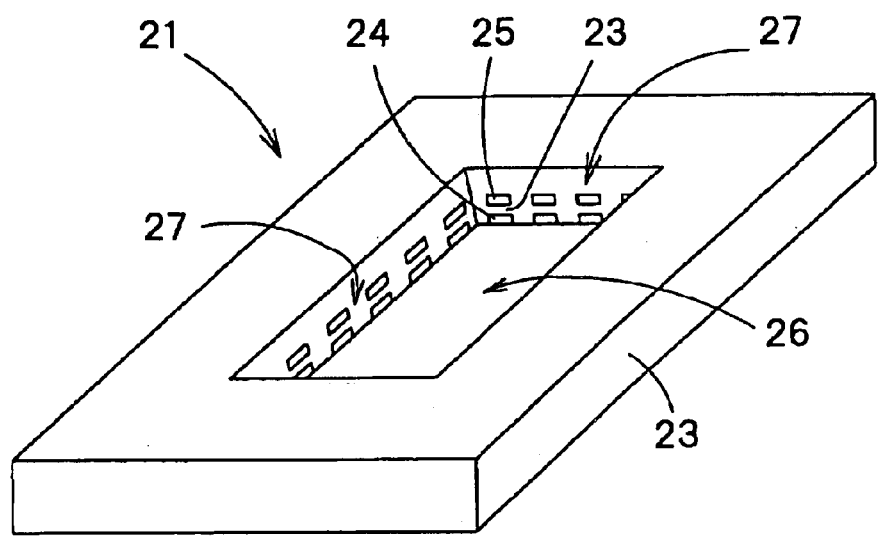
FIG. 5 is a perspective view showing a further embodiment of the phase change-type memory element according to the present invention.
Figure 6:
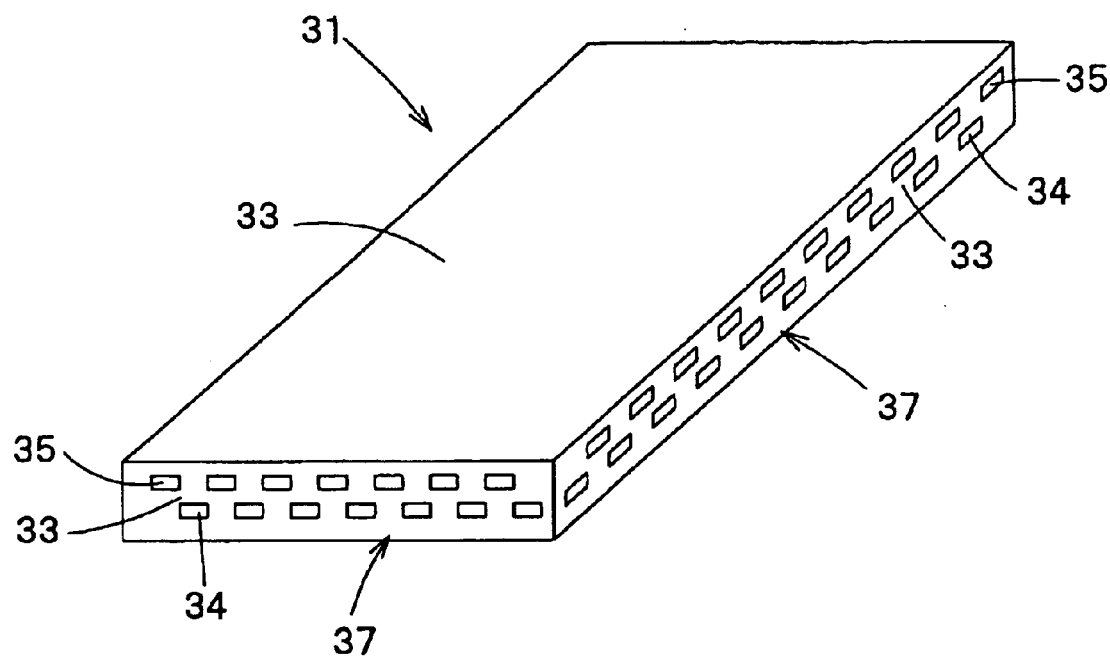
FIG. 6 is a perspective view showing a still further embodiment of the phase change-type memory element according to the present invention.

In the above embodiment, one memory area composed of a pair of electrodes and one phase change recording material layer is shown for convenience of explanation. However, it is a matter of course that the phase change-type memory element according to the present invention may have a plurality of memory areas. FIG. 5 is a perspective view showing another embodiment of the phase change-type memory element according to the present invention. A phase change-type memory element 21 includes an insulating layer 23 and a concave part 26 provided substantially the center of the insulating layer 23. The end face of each of a plurality of electrodes 24, 25 is exposed on each side wall surface of the concave part 26 to constitute an exposed surface 27. An insulating layer 23 is interposed between the electrode 24 and the electrode 25. A phase change recording material layer (not shown) is provided on the exposed surface 27. According to this construction, the phase change-type memory element 21 has in its concave part 26 a plurality of memory areas. FIG. 6 is a perspective view showing still another embodiment of the phase change-type memory element according to the present invention. A phase change-type memory element 31 includes an insulating layer 33 and a plurality of electrodes 34, 35. The end of the electrode 34 and the end of the electrode 35 are exposed to each side wall surface of the insulating layer 33. An insulating layer 33 is interposed between the electrode 34 and the electrode 35. Each of the side wall surfaces of the insulating layer 33 constitutes an exposed surface 37. A phase change recording material layer (not shown) is provided on the exposed surface 37. According to this construction, the phase change-type memory element 31 has a plurality of memory areas on the side wall surface of the insulating layer 33.

Figure 7:
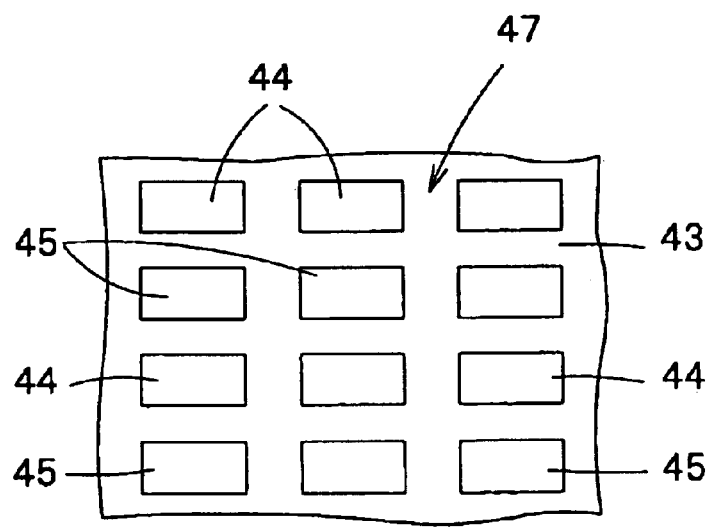
FIG. 7 is a diagram showing the arrangement of electrodes on an exposed surface of the phase change-type memory element according to the present invention.
Figure 8:
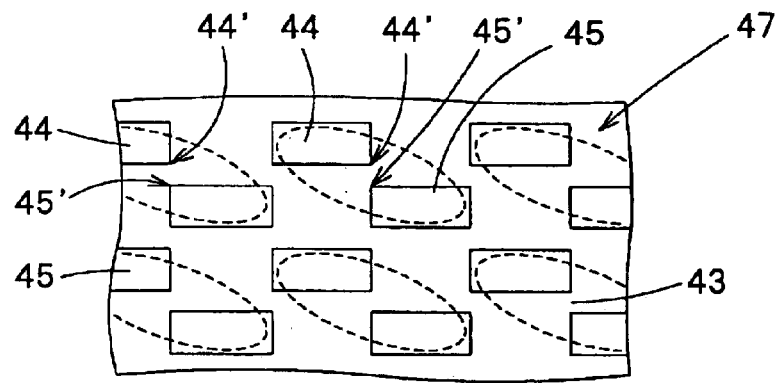
FIG. 8 is a diagram showing the arrangement of electrodes on an exposed surface of the phase change-type memory element according to the present invention.

When a plurality of pairs of electrodes separated by the insulating layer are present as in the above embodiment, the electrodes may be arranged with predetermined regularity. FIGS. 7 and 8 show embodiments of such arrangement of electrodes. FIG. 7 shows an exposed surface 47 in which electrodes 44, 45 are arranged in a lattice form in an insulating layer 43. FIG. 8 shows an exposed surface 47 in which electrodes 44, 45 are arranged in a checkerboard pattern in an insulating layer 43. In the embodiment shown in FIG. 8, regarding the electrode 44 and the electrode 45 constituting a pair of electrodes, that is, a pair of electrodes surrounded by a chained line in the drawing, the distance between the electrode 44 in its corner part 44' and the electrode 45 in its corner part 45' is significantly small. Therefore, the field strength can be increased, and the reset pulse current can be reduced.

Figure 9:
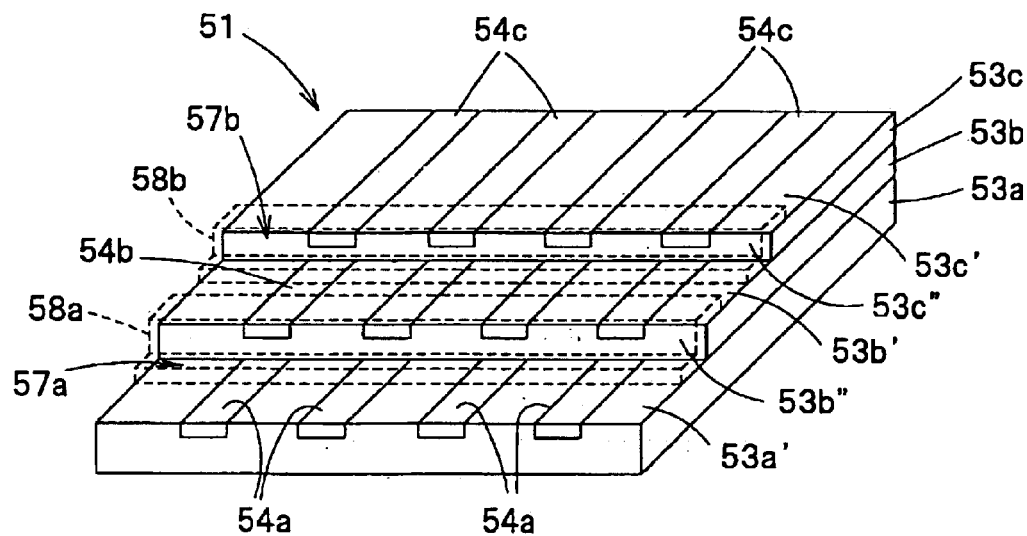
FIG. 9 is a perspective view showing another embodiment of the phase change-type memory element according to the present invention.

FIG. 9 is a perspective view showing a further embodiment of the phase change-type memory element according to the present invention. In FIG. 9, a phase change-type memory element 51 includes three insulating layers 53a, 53b, 53c which are put on top of one another in such a manner that the top surfaces 53a', 53b', 53c' on the end sides are exposed to form a stepwise laminated assembly. Electrodes 54a, 54b, 54c provided at predetermined intervals are exposed on the exposed top surfaces 53a', 53b', 53c'. Three faces, i.e., the insulating layer 53a in its top surface 53a' on which the electrode 54a is exposed, the end face 53b'' of the insulating layer 53b, and the insulating layer 53b in its top surface 53b' on which the electrode 54b is exposed, constitute one exposed surface 57a. A phase change recording material layer 58a indicated by a chained line in the embodiment shown in the drawing is provided on the exposed surface 57a to cover the electrodes 54a and 54b. Likewise, three faces, i.e., the insulating layer 53b in its top surface 53b' on which the electrode 54b is exposed, the end face 53c'' of the insulating layer 53c, and the insulating layer 53c in its top surface 53c' on which the electrode 54c is exposed, constitute one exposed surface 57b. A phase change recording material layer 58b indicated by a chained line in the embodiment shown in the drawing is provided on the exposed surface 57b to cover the electrodes 54b and 54c. In the embodiment shown in the drawing, the number of layers constituting the insulating layer is 3. However, the present invention is not limited to this only.

In this phase change-type memory element 51, the pair of electrodes 54a, 54b and the phase change recording material layer 58a constitute one memory area, and the pair of electrodes 54b, 54c and the phase change recording material layer 58b constitute one memory area. Thus, the phase change-type memory element 51 has a plurality of memory areas (8 in total in the embodiment shown in the drawing). Upon the application of a set pulse across the pair of electrode 54a and the electrode 54b or across the pair of electrode 54b and the electrode 54c, a current path is formed along the exposed surface 57a, 57b in the phase change recording material layer 58a or 58b to constitute a phase change area, and the phase state is changed from an amorphous state to a crystalline state. As a result, the electric resistance value is lowered to bring the phase change-type memory element 51 to an ON state. Upon the application of a reset pulse across the pair of electrode 54a and the electrode 54b or across the pair of electrode 54b and the electrode 54c, the phase state of the phase change area in the phase change recording material layer 58a or 58b is changed and is returned from the crystalline state to the amorphous state. This causes the electric resistance value to be increased to bring the phase change-type memory element 51 to an OFF state.

Figure 10:
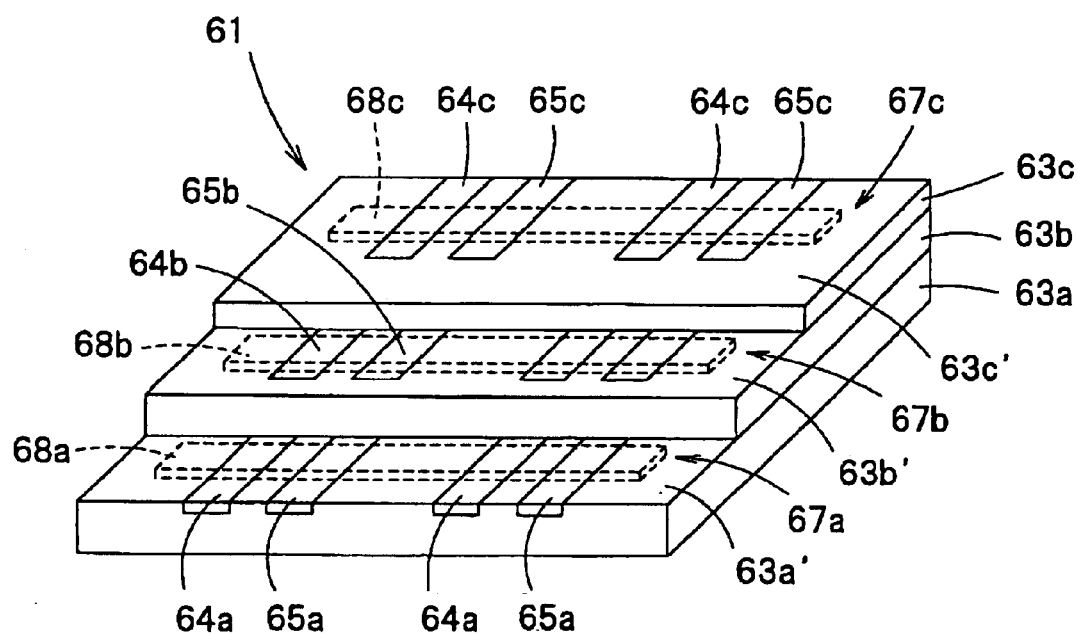
FIG. 10 is a perspective view showing still another embodiment of the phase change-type memory element according to the present invention.

FIG. 10 is a perspective view showing another embodiment of the phase change-type memory element according to the present invention. In FIG. 10, a phase change-type memory element 61 includes three insulating layers 63a, 63b, 63c which are put on top of one another in such a manner that the top surfaces 63a', 63b', 63c' on the end sides are exposed to form a stepwise laminated assembly. A plurality of pairs of electrodes 64a, 65a are provided and exposed at predetermined intervals on the top surface 63a' of the insulating layer 63a. Likewise, electrodes 64b, 65b are exposed on the top surface 63b' of the insulating layer 63b, and electrodes 64c, 65c are exposed on the top surface 63c' of the insulating layer 63c. The top surface 63a' of the insulating layer 63a on which the electrodes 64a, 65a are exposed constitutes one exposed surface 67a. A phase change recording material layer 68a indicated by a chained line in the embodiment shown in the drawing is provided on the exposed surface 67a to cover the electrodes 64a, 65a. Likewise, the top surface 63b' of the insulating layer 63b on which the electrodes 64b, 65b are exposed constitutes one exposed surface 67b. A phase change recording material layer 68b indicated by a chained line in the embodiment shown in the drawing is provided on the exposed surface 67b to cover the electrodes 64b, 65b. Further, the top surface 63c' of the insulating layer 63c on which the electrodes 64c, 65c are exposed constitutes one exposed surface 67c. A phase change recording material layer 68c indicated by a chained line in the embodiment shown in the drawing is provided on the exposed surface 67c to cover the electrodes 64c, 65c. In the embodiment shown in the drawing, the number of layers constituting the insulating layer is 3. However, the present invention is not limited to this only.

In this phase change-type memory element 61, the pair of electrodes 64a, 65a and the phase change recording material layer 68a constitute one memory area, the pair of electrodes 64b, 65b and the phase change recording material layer 68b constitute one memory area, and the pair of electrodes 64c, 65c and the phase change recording material layer 68c constitute one memory area. Thus, the phase change-type memory element 61 has a plurality of memory areas (6 in total in the embodiment shown in the drawing). For example, upon the application of a set pulse across the pair of electrode 64a and the electrode 65a, a current path is formed along the exposed surface 67a in the phase change recording material layer 68a to constitute a phase change area, and the phase state is changed from an amorphous state to a crystalline state. As a result, the electric resistance value is lowered to bring the phase change-type memory element 61 to an ON state. Upon the application of a reset pulse across the pair of electrode 64a and the electrode 65a, the phase state of the phase change area in the phase change recording material layer 68a is changed and is returned from the crystalline state to the amorphous state. This causes the electric resistance value to be increased to bring the phase change-type memory element 61 to an OFF state.

Figure 11:
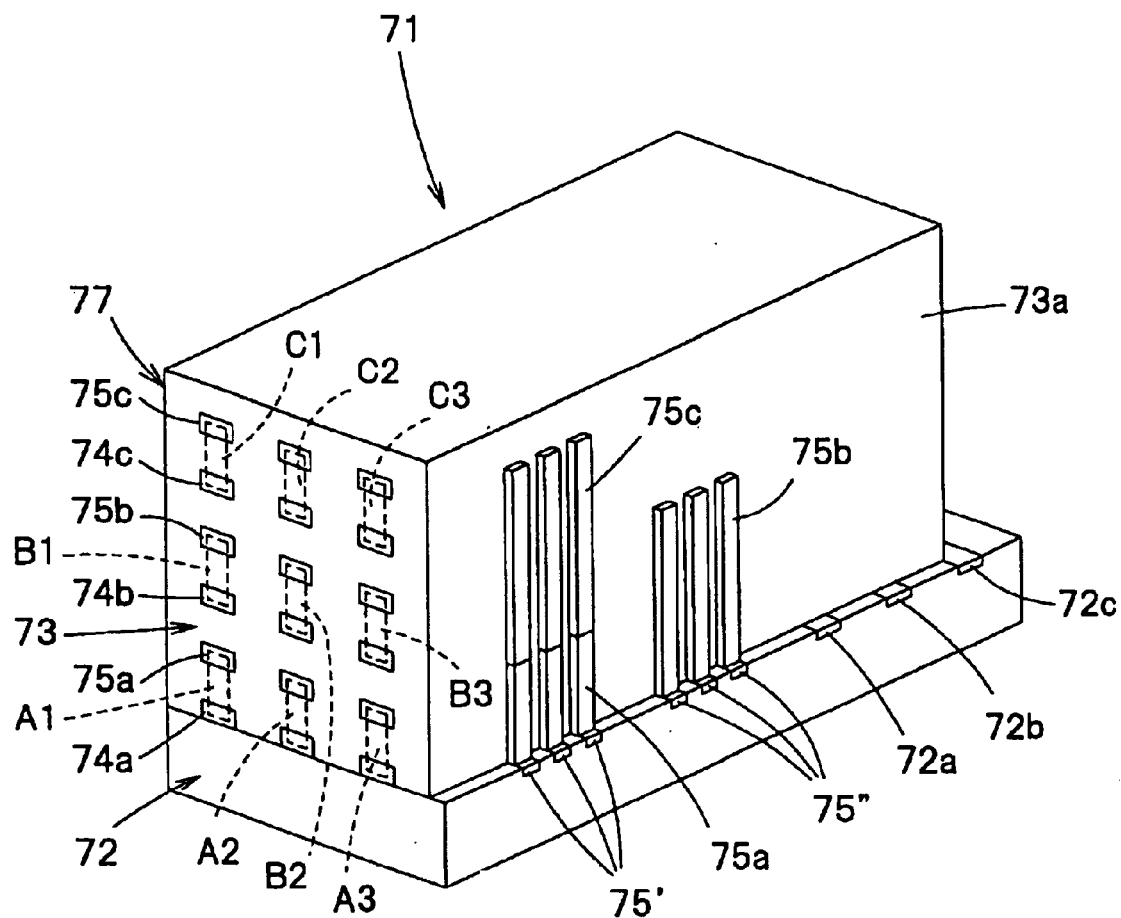
FIG. 11 is a perspective view showing an embodiment of the construction of electrodes elongated respectively from nine memory areas for connection of the memory areas to integrated circuit means provided with diodes in the phase change-type memory element according to the present invention.

The phase change-type memory element according to the present invention may further comprise an integrated circuit means for electrically separating the memory areas each comprising the pair of electrodes separated from each other by the insulating layer and the phase change recording material layer. The integrated circuit means may be provided, for example, with a conventional element such as a transistor or a diode. FIG. 11 is a perspective view showing an embodiment of the construction of electrodes elongated respectively from nine memory areas for connection of the memory areas to integrated circuit means provided with diodes. As shown in FIG. 11, a phase change-type memory element 71 includes a substrate 72 and, provided on the substrate 72, three electrodes 74a in a first layer, three electrodes 75a in a second layer, three electrodes 74b in a third layer, three electrodes 75b in a fourth layer, three electrodes 74c in a fifth layer, and three electrodes 75c in a sixth layer. An insulating layer 73 is interposed between individual electrodes. The end face of each of the 18 electrodes in total in the above six layers and the end face of the insulating layer constitute an exposed surface 77. A phase change recording material layer (not shown) is provided on the exposed surface 77.

In the phase change-type memory element 71, the three electrodes 74a in the first layer are connected to three diodes (not shown) provided at predetermined positions of an electrode 72a provided on the substrate 72, the three electrodes 74b in the third layer are connected to three diodes (not shown) provided at predetermined positions of an electrode 72b provided on the substrate 72, and the three electrodes 74c in the fifth layer are connected to three diodes (not shown) provided at predetermined positions of an electrode 72c provided on the substrate 72.

Further, in the phase change-type memory element 71, the three electrodes 75a in the second layer and the three electrodes 75c in the sixth layer are drawn through the insulating layer 73 to an insulating layer side wall surface 73a and are connected to terminal parts 75' on the substrate 72. Furthermore, the three electrodes 75b in the fourth layer are also drawn through the insulating layer 73 to the insulating layer side wall surface 73a and are connected to terminal parts 75" on the substrate 72.

The electrodes in the above six layers will be described in more detail with reference to FIGS. 12 to 14.

Figure 12:
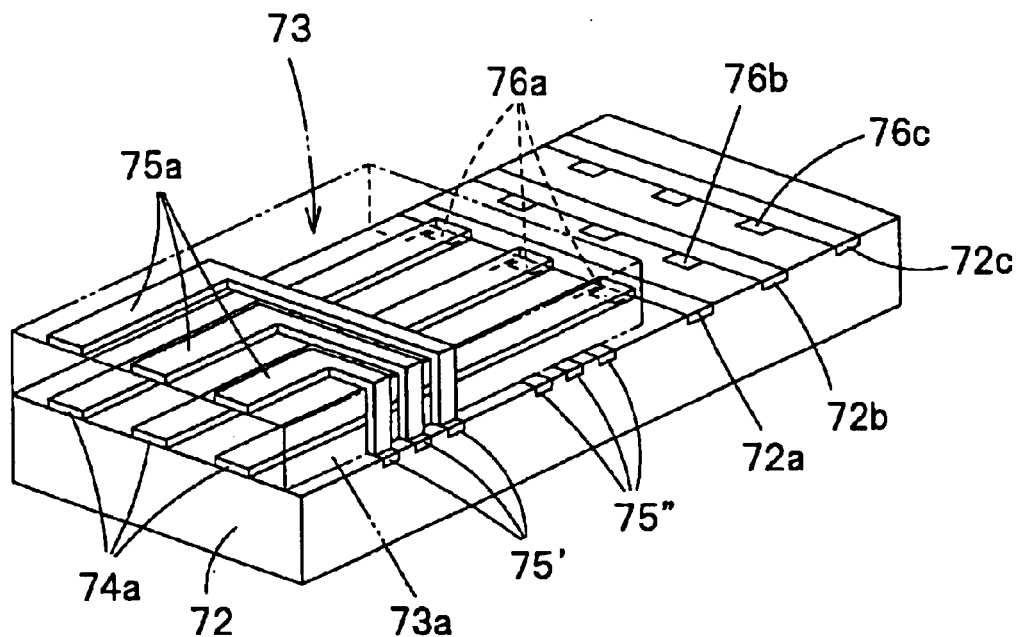
FIG. 12 is a perspective view showing the arrangement of three electrodes in a first layer and three electrodes in a second layer in the phase change-type memory element shown in FIG. 11.

FIG. 12 is a perspective view showing the arrangement of the three electrodes 74a in the first layer and the three electrodes 75a in the second layer shown in FIG. 11. In FIG. 12, the three electrodes 74a in the first layer are elongated and connected to the three diodes 76a provided at predetermined positions of the electrode 72a provided on the substrate 72. The three electrodes 75a in the second layer provided on the three electrodes 74a in the first layer through the insulating layer 73 indicated by an alternate long and short dash line are drawn toward the insulating layer side wall surface 73a, are elongated on the insulating layer side wall surface 73a and are connected to the terminal parts 75' on the substrate 72.

Figure 13:
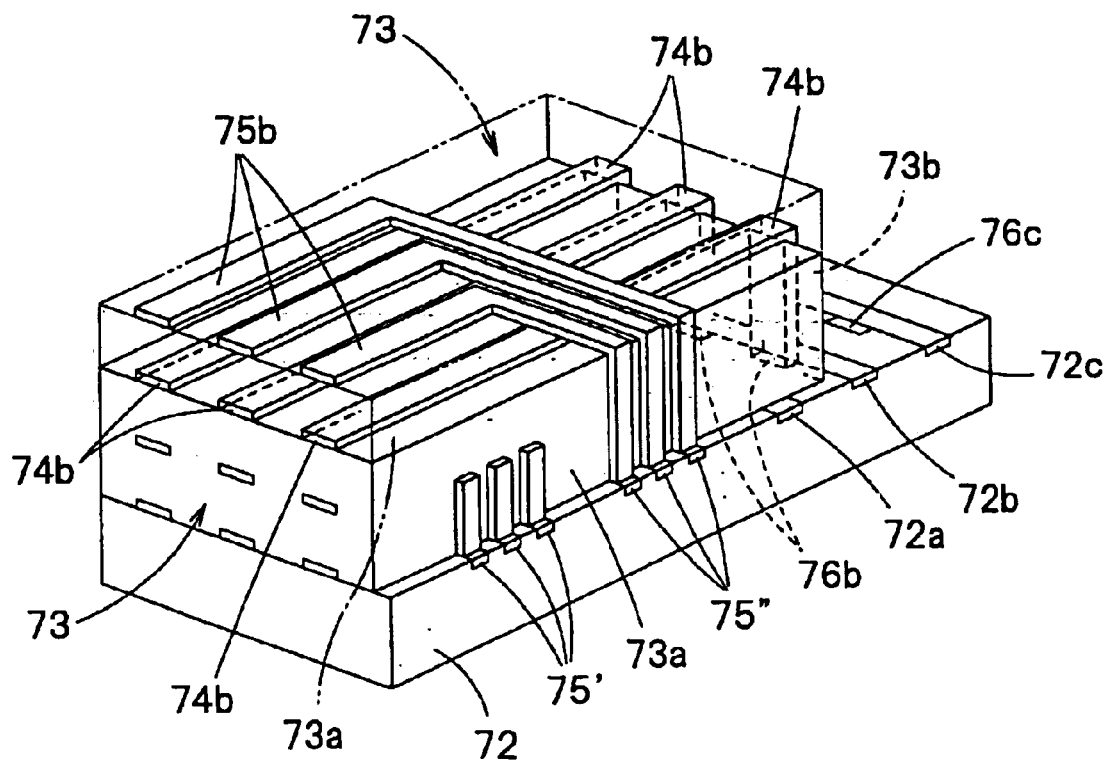
FIG. 13 is a perspective view showing the arrangement of three electrodes in a third layer and three electrodes in a fourth layer in the phase change-type memory element shown in FIG. 11.

FIG. 13 is a perspective view showing the arrangement of the three electrodes 74b in the third layer and the three electrodes 75b in the fourth layer shown in FIG. 11. In FIG. 13, the three electrodes 74b in the third layer are elongated, on the insulating layer 73 provided so as to cover the three electrodes 75a in the second layer, toward an insulating layer back wall surface 73b, are elongated on the insulating layer back wall surface 73b and are connected to the three diodes 76b provided at predetermined positions of the electrode 72b provided on the substrate 72. The three electrodes 75b in the fourth layer provided on the three electrodes 74b in the third layer through the insulating layer 73 indicated by an alternate long and short dash line are drawn toward the insulating layer side wall surface 73a, are elongated on the insulating layer side wall surface 73a and are connected to terminal parts 75" on the substrate 72. The three terminal parts 75" may be three terminal parts common to the three terminal parts 75" and the three terminal parts 75'.

Figure 14:
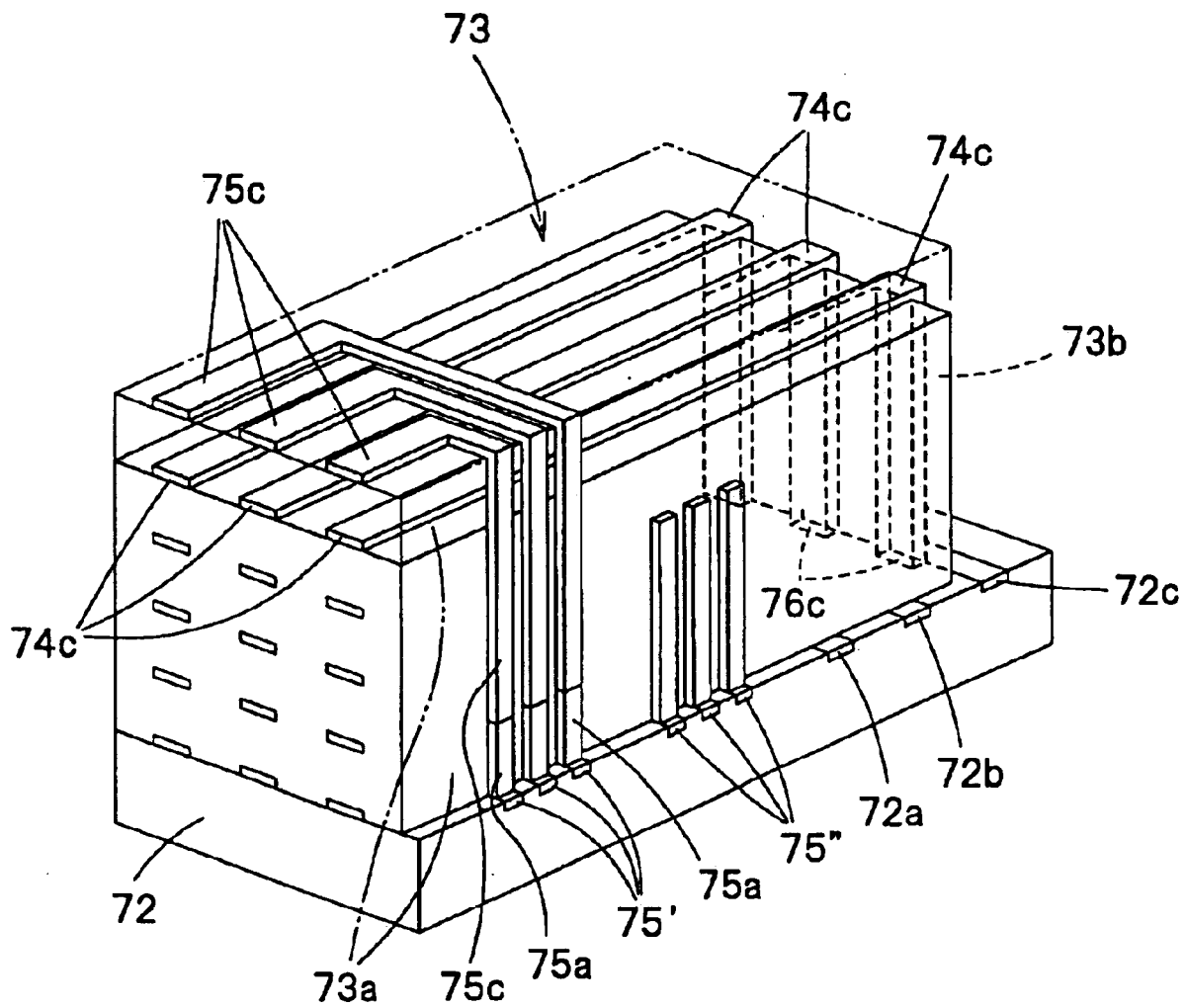
FIG. 14 is a perspective view showing the arrangement of three electrodes in a fifth layer and three electrodes in a sixth layer in the phase change-type memory element shown in FIG. 11.

FIG. 14 is a perspective view showing the arrangement of the three electrodes 74c in the fifth layer and the three electrodes 75c in the sixth layer shown in FIG. 11. In FIG. 14, the three electrodes 74c in the fifth layer are elongated, on the insulating layer 73 provided so as to cover the three electrodes 75b in the fourth layer, toward an insulating layer back wall surface 73b, are elongated on the insulating layer back wall surface 73b and are connected to the three diodes 76c provided at predetermined positions of the electrode 72c provided on the substrate 72. The three electrodes 75c in the sixth layer provided on the three electrodes 74c in the fifth layer through the insulating layer 73 indicated by an alternate long and short dash line are drawn toward the insulating layer side wall surface 73a and, together with the three electrodes 75a in the second layer, are elongated on the insulating layer side wall surface 73a and are connected to terminal parts 75' on the substrate 72.

Thus, the individual end faces of the three electrodes 74a in the first layer and the individual end faces of the three electrodes 75a in the second layer constitute three memory areas A1, A2, A3 (areas surrounded by chained lines in the drawing). Likewise, the individual end faces of the three electrodes 74b in the third layer and the individual end faces of the three electrodes 75b in the fourth layer constitute three memory areas B1, B2, B3 (areas surrounded by chained lines in the drawing), and the individual end faces of the three electrodes 74c in the fifth layer and the individual end faces of the three electrodes 75c in the sixth layer constitute three memory areas C1, C2, C3 (areas surrounded by chained lines in the drawing).

Further, in the above embodiment, the terminal parts 75', provided on the substrate 72, to which the three electrodes 75a in the second layer and the three electrodes 75c in the sixth layer are connected, are electrically isolated from the terminal parts 75", provided on the substrate 72, to which the three electrodes 75b in the fourth layer are connected. Therefore, the memory areas can be changed. Specifically, the individual end faces of the three electrodes 75a in the second layer and the individual end faces of the three electrodes 74b in the third layer can constitute three memory areas, and the individual end faces of the three electrodes 75b in the fourth layer and the individual end faces of the three electrodes 74c in the fifth layer can constitute three memory areas.

In the phase change-type memory element according to the present invention, the phase change recording material layers, the exposed electrodes and the like may be covered for sealing from the viewpoint of preventing the influence of an external environment. Sealing members usable herein include epoxy, silicon and other sealing members.

Production Process of Phase Change-Type Memory Element

Next, the production process of the phase change-type memory element according to the present invention will be described by taking a phase change-type memory element shown in FIGS. 15 and 16 as an example.

Figure 15:
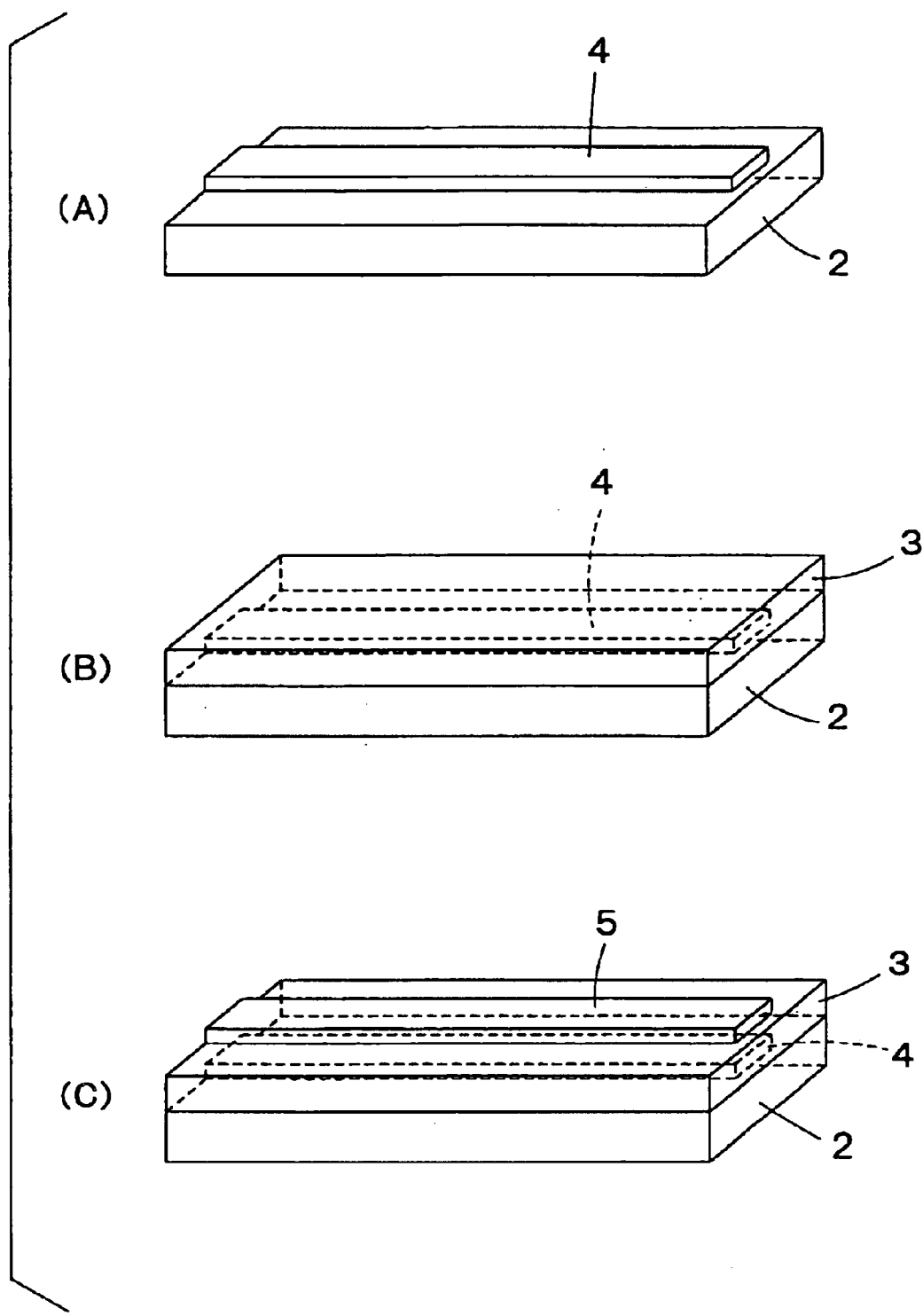
FIG. 15 is a process diagram illustrating a production process of a phase change-type memory element according to the present invention.
Figure 16:
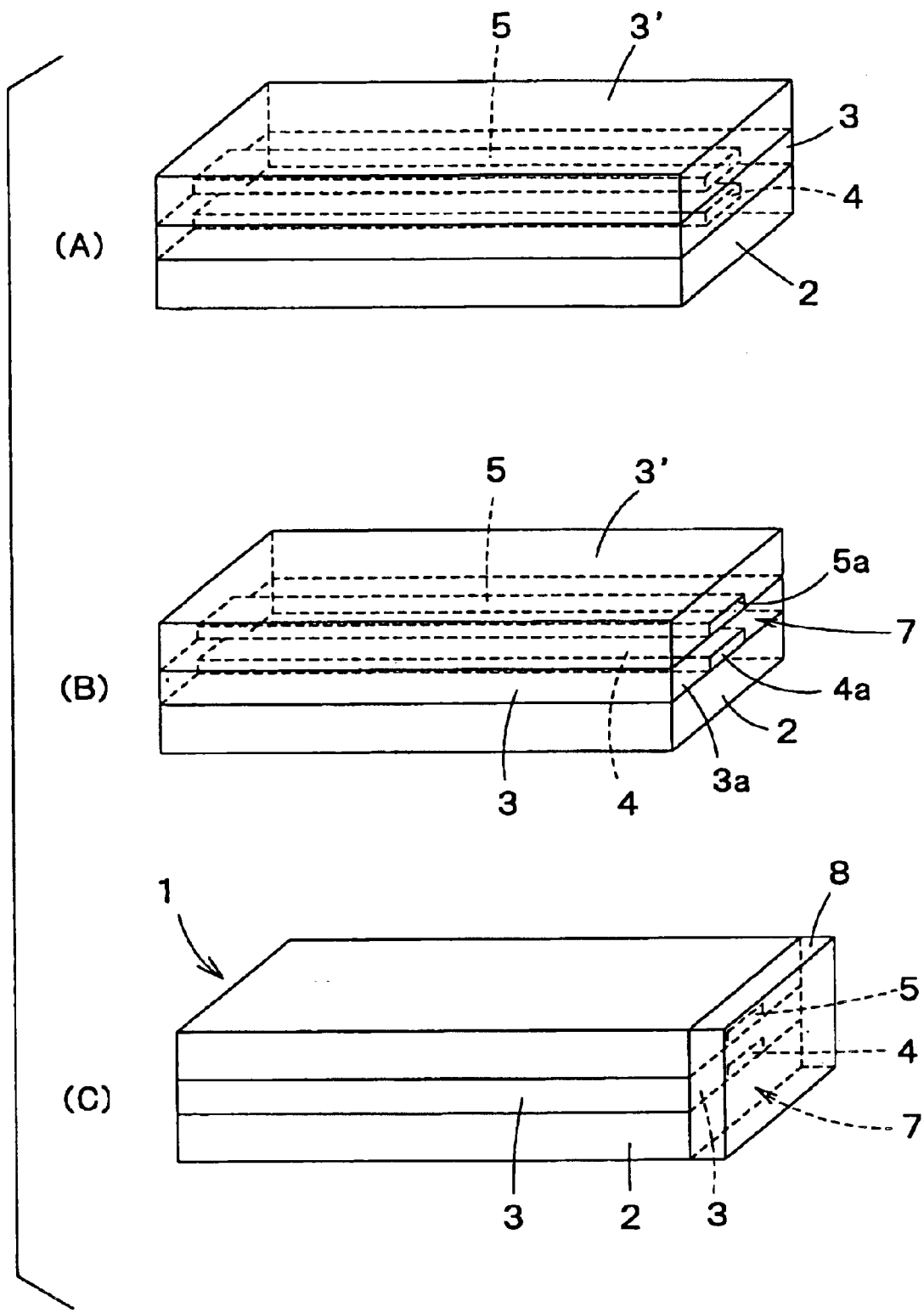
FIG. 16 is a process diagram illustrating a production process of a phase change-type memory element according to the present invention.

FIGS. 15 and 16 are process diagrams illustrating a production process of the phase change-type memory element according to the present invention. In the present invention, at the outset, a conductive layer is formed using an electrically conductive material such as nickel, aluminum, or gold on a substrate 2 such as a single-crystal semiconductor substrate or a glass substrate. The conductive layer is patterned by photography or the like to form an electrode layer 4 (FIG. 15 (A)).

Next, an insulating layer 3 formed of silicon oxide (SiOx), alumina, polyimide or the like is stacked on the substrate 2 to cover the electrode layer 4 (FIG. 15 (B)). The insulating layer 3 may be formed, for example, by a chemical method such as vapor phase epitaxy or liquid phase epitaxy, or a physical method such as coating, vacuum deposition, or sputtering. Further, a conductive layer is formed using an electrically conductive material such as nickel, aluminum or gold on the insulating layer 3. This conductive layer is patterned by photography or the like to form an electrode layer 5 (FIG. 15 (C)). Thus, the electrode 4 and the electrode 5 are provided separately from each other through the insulating layer 3.

Next, an insulating layer 3' such as silicon oxide (SiOx), alumina or polyimide is stacked on the insulating layer 3 to cover the electrode layer 5 (FIG. 16 (A)). Thereafter, an exposed surface, in which the insulating layer 3 in its end face 3a, the electrode 4 in its end face 4a, and the electrode 5 in its end face 5a are exposed perpendicularly to the direction, in which the electrodes 4, 5 are elongated (a direction indicated by an arrow a in FIG. 16 (A)), is formed (FIG. 16 (B)). The exposed surface 7 may be formed, for example, by etching, mechanical cutting and breaking such as wire cutting, or cutting by a masking ion beam.

Next, a phase change recording material layer 8 is formed on the exposed surface 7 (FIG. 16 (C)). The phase change recording material layer 8 may be formed by coating, vacuum deposition, sputtering, plasma CVD, ion plating or the like. The thickness of the phase change recording material layer 8 is in the range of 1 to 1,000 nm, preferably in the range of 1 to 500 nm. In the present invention, reducing the thickness of the phase change recording material layer 8 and controlling the thickness of the phase change recording material layer 8 can be easily achieved.

In the production process of the present invention, the thickness of the insulating layer 3, which determines the distance between the electrodes 4, 5, can be controlled on a nano order. Therefore, the integration density of the memory area can be made larger than that in the conventional phase change-type memory element. Further, the step of forming a contact hole and the step of forming a columnar phase change recording material are unnecessary. This simplifies the production process.

EXAMPLES

The following Examples further illustrate the present invention.

Example 1

A conductive layer of nickel was formed by sputtering on a glass substrate. The conductive layer was patterned by photography to form a stripe-shaped electrode layer having a thickness of 200 nm and a width of 1.0 μm. Next, an insulating layer of $SiO_2$ was formed by plasma CVD on the glass substrate so as to cover the electrode layer (thickness of the insulating layer on the electrode layer: 200 nm). Thereafter, a conductive layer of nickel was formed by sputtering on the insulating layer 3. The conductive layer was patterned by photography to form a stripe-shaped electrode layer having a thickness of 200 nm and a width of 1.0 μm so that this electrode layer was located opposite to the above electrode layer through the insulating layer. Thus, a laminate structure, in which two 200 nm-thick stripe-shaped electrode layers had been separated by a 200 nm-thick insulating layer, was formed.

An insulating layer of $SiO_2$ (thickness: 0.2 μm) was then formed by plasma CVD on the insulating layer so as to cover the electrode layer.

Next, the glass substrate, the electrode layers, and the insulating layer were cut by a wire cutter perpendicularly to the elongation direction of the stripe-shaped electrodes, and the section was polished to form an exposed surface on which the end faces of the electrodes were exposed.

A thin layer of a chalcogenide (TeSb) alloy was then formed by sputtering on the exposed surface. A phase change recording material layer (thickness: 200 nm) was formed to prepare a phase change-type memory element.

For the phase change-type memory element thus obtained, writing, reading, erasing, and reading were carried out in that order. Specifically, a set pulse current (1.0 mA) was applied across the electrodes to bring the phase change-type memory element to an ON state. A read pulse current (0.01 mA) was then applied to perform reading. Next, a reset pulse current (5.0 mA) was applied across the electrodes to bring the phase change-type memory element to an ON state, and a read pulse current (0.01 mA) was then applied to perform reading. This procedure was regarded as one recording, and the recording was repeated 30 times. As a result, the average electric resistance value during reading in ON state was about 450 Ω, and the average electric resistance value during reading in OFF state was about 1800 Ω. This demonstrates that the phase change-type memory element according to the present invention can reliably function even at a low reset pulse current.

Example 2

A phase change-type memory element was prepared in the same manner as in Example 1, except that the thickness and the width of the two stripe-shaped electrode layers were changed to 50 nm and 0.5 μm, respectively, and the thickness of the thin layer of the chalcogenide (TeSb) alloy as the phase change recording material layer was changed to 10 nm.

For the phase change-type memory element thus obtained, writing, reading, erasing, and reading were carried out in that order in the same manner as in Example 1. As a result, the average electric resistance value during reading in ON state was about 200 Ω, and the average electric resistance value during reading in OFF state was about 800 Ω. This demonstrates that the phase change-type memory element according to the present invention can reliably function even at a low reset pulse current.

As is apparent from the foregoing detailed description, according to the present invention, a phase change recording material layer is provided on an exposed surface, on which an insulating layer and at least two electrodes are exposed, so that the phase change recording material layer is brought into contact with the at least two electrodes. Therefore, a current path in the phase change recording material layer is formed along the exposed surface, and the volume of a phase change area of which the state is reversibly changed between ON state and OFF state is small. Therefore, the current value of the reset pulse for returning the ON state to the OFF state is small. Further, the phase change recording material layer except for the phase change area may be in an amorphous or crystalline state. Therefore, the formation of the phase change recording material layer is not restricted by the process temperature in the production of the phase change-type memory element. Furthermore, since the thickness of the insulating layer, which determines the distance between the electrodes, can be controlled on a nano order, the integration density of the memory area can be made much larger than that in the conventional phase change-type memory element. In addition, since neither a contact hole nor a columnar phase change recording material is used, the production of the phase change-type memory element is advantageously simple.

What is claimed is:

1. A phase change-type memory element comprising:
   two or more electrodes provided through an insulating layer;
   an exposed surface on which at least a part of the insulating layer and at least a part of each of the electrodes are exposed; and
   a phase change recording material layer provided, on said exposed surface, in contact with said at least two electrodes.

2. The phase change-type memory element according to claim 1, wherein said exposed surface is constituted by at least one of a plane surface, a multiplane surface, and a curved surface.

3. The phase change-type memory element according to claim 1, wherein the phase change recording material layer has a thickness in the range of 1 to 1,000 nm.

4. The phase change-type memory element according to claim 1, wherein the insulating layer interposed between a pair of the electrodes constituting one memory area has a thickness in the range of 10 to 1,000 nm.

5. The phase change-type memory element according to claim 1, wherein the phase change recording material layer contains at least one chalcogenide.

6. The phase change-type memory element according to claim 1, wherein the phase change recording material layer is formed of an organic material.

7. The phase change-type memory element according to claim 1, wherein a barrier layer and/or a heat control layer are provided between the exposed surface and the phase change recording material layer.

8. A process for producing a phase change-type memory element, comprising the steps of:

providing two or more electrodes opposite to each other through an insulating material;

forming an exposed surface on which at least a part of the insulating material and at learnt a part of each of the electrodes are exposed and forming a phase change recording material layer on the exposed surface so as to be in contact with at least two of the electrodes.

* * * * *